(12) United States Patent
Shah

(10) Patent No.: US 10,088,535 B1
(45) Date of Patent: Oct. 2, 2018

(54) SYSTEM AND METHOD FOR MEASURING A MAGNETIC GRADIENT FIELD

(71) Applicant: QuSpin, Inc., Louiville, CO (US)

(72) Inventor: Vishal Shah, Westminister, CO (US)

( * ) Notice: Subject to any disclaimer, the term of this patent is extended or adjusted under 35 U.S.C. 154(b) by 0 days.

(21) Appl. No.: 16/001,633

(22) Filed: Jun. 6, 2018

(51) Int. Cl.
| | | |
|---|---|---|
| *G01V 3/00* | (2006.01) | |
| *G01R 33/26* | (2006.01) | |
| *G01R 33/032* | (2006.01) | |
| *G01R 33/12* | (2006.01) | |

(52) U.S. Cl.
CPC ........... *G01R 33/26* (2013.01); *G01R 33/032* (2013.01); *G01R 33/1284* (2013.01)

(58) Field of Classification Search
CPC .................................................... G01R 33/26
USPC ............... 324/301, 304, 305, 244.1, 260
See application file for complete search history.

(56) References Cited

U.S. PATENT DOCUMENTS

| | | | |
|---|---|---|---|
| 2,929,018 | A | 3/1960 | Varian |
| 2,996,657 | A | 8/1961 | Varian |
| 3,252,081 | A | 5/1966 | Ruddock et al. |
| 3,281,663 | A | 10/1966 | Arditi |
| 4,260,949 | A | 4/1981 | Dalton |
| 4,327,327 | A | 4/1982 | Greenwood et al. |
| 6,995,558 | B2 | 2/2006 | Butters et al. |
| 7,081,747 | B2 | 7/2006 | Butters et al. |
| 7,378,843 | B2 | 5/2008 | Beranger |
| 7,521,928 | B2 | 4/2009 | Romalis et al. |
| 7,573,264 | B2 | 8/2009 | Xu et al. |
| 8,264,693 | B2 | 9/2012 | Stoica et al. |
| 8,289,018 | B2 * | 10/2012 | Narducci ............. G01R 33/022 250/251 |
| 8,362,768 | B2 | 1/2013 | Nagasaka |

(Continued)

OTHER PUBLICATIONS

JM Kohel, RJ Thompson, Jr Kellogg . . . —Earth Science . . . , 2008—esto.ndc.nasa.gov.

(Continued)

*Primary Examiner* — Louis Arana
(74) *Attorney, Agent, or Firm* — Patricia C. Brzostowicz; Superior Patent Group

(57) ABSTRACT

A system and method is described to measure the magnetic field gradient using an optically pumped magnetometer configured as an intrinsic gradiometer. Atoms are prepared in a freely precessing coherent superposition of the magnetically sensitive hyperfine ground states in two or more physically separated locations. A probe laser beam is used to interrogate atoms in both locations. As the probe light beam passes through the coherent atoms, optical sidebands are self-generated at the ground state hyperfine frequency of the magnetically sensitive states. Each of the two sets of atoms produces distinct sidebands at a frequency separation proportional to the magnetic field experienced by each set of atoms. The probe light is captured using a photodetector. The self-generated probe optical sidebands interfere to produce a beat note whose frequency is proportional to the magnetic field gradient between the two sets of atoms. Measuring the frequency of the beat note therefore provides an accurate reading of the magnetic field gradient. An optical filter or a polarizer can be additionally used to remove the central frequency of the probe light, thus removing the noise produced by the residual probe beam.

16 Claims, 5 Drawing Sheets

(56) References Cited

U.S. PATENT DOCUMENTS

| | | |
|---|---|---|
| 8,421,455 B1 | 4/2013 | Hovde et al. |
| 8,547,090 B2 | 10/2013 | Lukin et al. |
| 8,947,080 B2 | 2/2015 | Lukin et al. |
| 8,957,677 B2 | 2/2015 | Nagasaka |
| 9,167,979 B2 | 10/2015 | Skidmore et al. |
| 2004/0012388 A1 | 1/2004 | Pedersen |
| 2010/0188081 A1* | 7/2010 | Lammegger ......... G01R 33/032 324/304 |
| 2010/0308814 A1 | 12/2010 | Wu |
| 2014/0354275 A1 | 12/2014 | Sheng et al. |

OTHER PUBLICATIONS

Development of a transportable quantum gravity gradiometer for gravity field mapping—attached as Yu_Nan_B4P3.pdf.

3. Sensitive absolute-gravity gradiometry using atom interferometry J. M. McGuirk, G. T. Foster, J. B. Fixler, M. J. Snadden, and M. A. Kasevich Phys. Rev. A 65, 033608—Published Feb. 8, 2002.

Alexey V Veryaskin Published Feb. 2018 • Copyright © 2018 Morgan & Claypool Publishers pp. 3-1 to 3-16.

Budker and Romalis, 2010: Budker, D. and M. Romalis, Optical magnetometry. Nat Phys, 2007. 3(4): p. 227-234.

Firester & Carver, 1966: Firester, A.H., Carver, T.R., 1966. Light Modulation at the Ground-State Hyperfine—Separation Frequency of Potassium. Phys. Rev. Lett. 17, 947-949.

Mathur 1968: Mathur, B.S., Tang, H., Bulos, R., Flapper, W, 1968. Microwave Light Modulation by an Optically Pumped Rb87 Vapor. Phys. Rev. Left. 21, 1035-1038.

Tang 1973: Tang, H., 1973. Parametric Frequency Conversion of Resonance Radiation in Optically Pumped Rb87 Vapor. Phys. Rev. A 7, 2010-2032.

Shah et al., 2007: Shah, V., Knappe, S., Hollberg, L, Kitching, J., 2007. High-contrast coherent population trapping resonances using four-wave mixing in 87Rb. Opt. Lett. 32, 1244-1246.

Vukicevic et al., 2000: N. Vukicevic, A. Zibrov, L. Hollberg, F. Walls, J. Kitching, and H. Robinson, IEEE Trans. Ultrason. Ferroelectr. Freq. Control 47, 1122 (2000).

Hemmer et al., 1995: P. R. Hemmer, D. P. Katz, J. Donoghue, M. Cronin-Golomb, M. S. Shahriar, P. Kummar, "Efficient low-intensity optical phase conjugation based on coherent population trapping in sodium," Opt. Lett., vol. 20, p. 982, 1995.

Lu et al., 1998: B. Lu, W. H. Burkett, M. Xiao, "Efficient low-intensity optical phase conjugation based on coherent population trapping in sodium," Opt. Lett., vol. 23, pp. 804-806, 1998.

\* cited by examiner

SYSTEM AND METHOD FOR MEASURING A MAGNETIC GRADIENT FIELD

The following application is an application for patent under 35 USC 111 (a). This invention was made with government support under contract number D16PC00195 awarded by the Defense Advanced Research Projects Agency (DARPA). The government has certain rights in the invention.

FIELD OF INVENTION

This disclosure relates to magnetic field imaging, specifically a system and method thereof.

BACKGROUND

Optically pumped magnetometers (OPMs), also called atomic magnetometers, optical magnetometers, or optical atomic magnetometers, operate by measuring the transition frequency between two magnetically sensitive ground states of atoms with unpaired electrons such as rubidium (Rb), cesium (Cs), and potassium (K) for example. For an overview, see Budker and Romalis (Budker and Romalis, 2010). When measuring the transition frequency between Zeeman levels of the same hyperfine ground state, the frequency is in the kHz range, and when measuring the transition frequency between Zeeman levels of two different hyperfine states, the frequency is in the GHz range. Building a magnetometer using Zeeman levels of two different hyperfine states is generally less preferred due to the need for additional microwave circuitry, and because the signal-to-noise ratio is often found to be lower. For this reason, all commercial variants of the optically pumped magnetometers available today rely on Zeeman transitions within the same hyperfine state. Here we disclose a device that measures magnetic field gradient, a gradiometer, in place of magnetic field, magnetometer, and in this case we find the use of Zeeman levels of separate hyperfine transitions to be particularly advantageous in addressing the drawbacks of hyperfine magnetometers described in prior-art, as in Arditi, U.S. Pat. No. 3,281,663A, and Alzetta, 1976.

For many applications, such as brain imaging, magnetic gradiometers, devices that measure the difference in the magnetic field at two locations, are greatly preferred over pure magnetometers due to gradiometer's ability to remove common mode magnetic field noise. However, building intrinsic gradiometers, devices that measure magnetic gradient field directly, has proven difficult without first building two separate magnetometers and then subtracting their outputs, as in a synthetic gradiometer. The synthetic gradiometer approach is technologically more complex and does not provide perfect cancellation over all frequency range. In the prior art, potential gradiometer schemes using hyperfine transitions have been disclosed (Affolderbach, 2002), but they are synthetic and not intrinsic. Here we disclose a system and a method of building a very high-performance intrinsic gradiometer leveraging hyperfine transitions.

SUMMARY OF THE INVENTION

Here we disclose a system and method to directly detect gradient field without the need for the complex intermediate step of first measuring the magnetic field at two locations. The ability to measure gradient field directly without measuring the magnetic field leads to near perfect common mode magnetic field noise cancellation.

The invention is a system and method to measure magnetic field gradients by measuring the difference of hyperfine frequency between two spatially separated precessing spin ensembles through direct optical detection of the beat note of the two hyperfine frequencies. In order to achieve this, two ensembles of atoms in two locations are spin polarized via optical pumping. The ensembles are separated by a distance called the gradiometer baseline. A microwave pulse, such as a $\pi/2$ pulse, resonant with two magnetically sensitive energy levels of different ground-state hyperfine manifolds, is applied to induce free precession in alkali atoms. A probe laser beam tuned to an optical resonance line, such as the D1 or the D2 transition, is passed through the precessing atomic spins. The light from the probe laser beam interacts with the coherently free precessing atoms and gets self-modulated at a microwave frequency, wherein the frequency is proportional to the magnetic field experienced by the atoms in each ensemble. The microwave modulation of the probe laser beam generates optical sidebands which are separated by microwave frequency.

If the two ensembles experience a different magnetic field, the probe beam is modulated at two different microwave frequencies. When this doubly modulated probe light falls on a photodetector, its sidebands interfere and produce a low frequency beat note signal which can be easily observed using ordinary low-bandwidth oscilloscopes and recorded with low speed electronics. The frequency of the beat note signal is directly proportional to the difference in the magnetic field experienced by the two ensembles. Thus, by measuring the frequency of the beat note signal alone, gradiometer output is obtained with nearly perfect common mode noise cancellation without ever needing high-speed microwave electronics to detect individual magnetic resonances or phase matching electronics for synthetic noise cancellation with signal post processing.

In addition to providing direct detection of the beat note, the current invention allows for removal of the residual carrier probe light that has not interacted with the atoms, and therefore does not carry any useful gradient signal information. The carrier can be removed using a narrow-band optical filter, a polarizer, or an atomic filter cell that absorbs the carrier probe light but lets the signal carrying microwave sidebands to pass through largely unattenuated. Removing the residual probe light can greatly improve signal-to-noise ratio which is one of the main problems that has plagued hyperfine magnetometers/gradiometers in prior art. Such optical filtering is possible on hyperfine transitions alone because the signal producing sidebands are separated from the carrier light by several GHz.

In prior art, Arditi forms a hyperfine magnetometer by exciting different hyperfine transitions in the atoms of two vapor cells. We excite the same hyperfine transitions in the two vapor cells and use the system to form an intrinsic gradiometer without ever needing to first form a magnetometer. In addition, our device uses optical detection to directly measure the beat note by leveraging the process of optical sideband generation. Arditi requires the use of a microwave cavity to first receive the microwave signals at the hyperfine precession frequency and then mix the microwave signals from microwave cavities around the two vapor cells to generate a beat note. The efficiency of detecting microwave signals using a cavity, or other such means is far lower compared with direct optical detection of the beat note, enabling our method to achieve much higher performance.

In prior art, Affolderbach discloses a hyperfine magnetic gradiometer formed inside a single vapor cell using two light beams to first form two independent magnetometers, and then subtracting the output of the two magnetometers to build a magnetic gradiometer. In addition to numerous differences, our invention forms an intrinsic gradiometer directly without the need to form individual magnetometers.

Before explaining the disclosed embodiments of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE INVENTION

Figure 1:
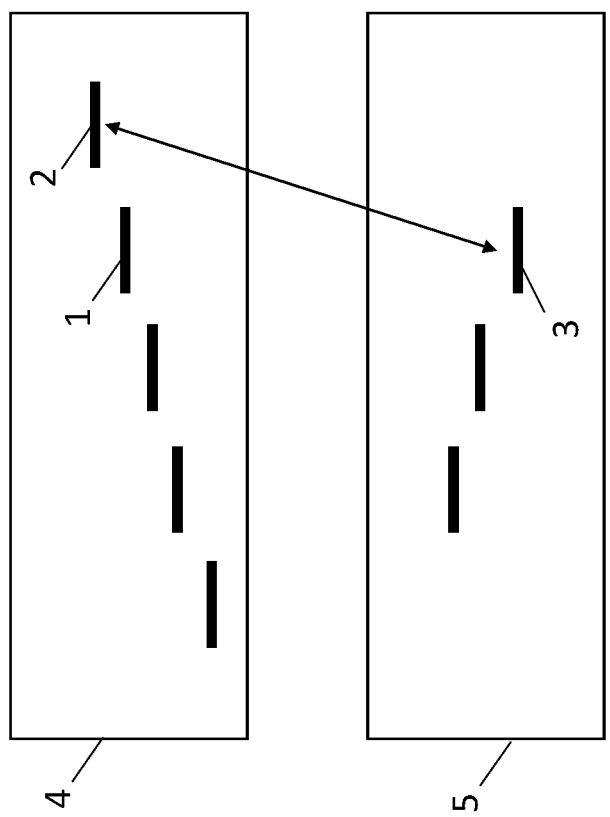
FIG. 1 is a schematic diagram illustrating the energy splitting of $^{87}$Rb as well as an example of the Zeeman and Hyperfine transitions that can be used for magnetic field measurements of the present invention.

FIG. 1 is a schematic showing the energy level diagram of the $5S_{1/2}$ ground state of $^{87}$Rb. Other atoms including $^{85}$Rb, $^{133}$Cs, $^{39}$K, $^{41}$K, helium (He) and artificial atoms such as nitrogen vacancy centers may be used as well. The choice of $^{87}$Rb serves an illustrative purpose. Prior art Zeeman magnetometers operate with transitions involving two Zeeman sublevels 1 and 2 of the same hyperfine manifold 4. In contrast, the hyperfine gradiometer of the present invention involves sublevels 2 and 3 of two distinct hyperfine manifolds 4 and 5. The transition frequency between the two hyperfine manifolds 4 and 5 is usually in the range of hundreds of megahertz to several gigahertz, while the transition frequencies between the Zeeman sublevels in the same hyperfine manifold is on the order of hundreds of kilohertz in Earth's magnetic field.

Figure 2:
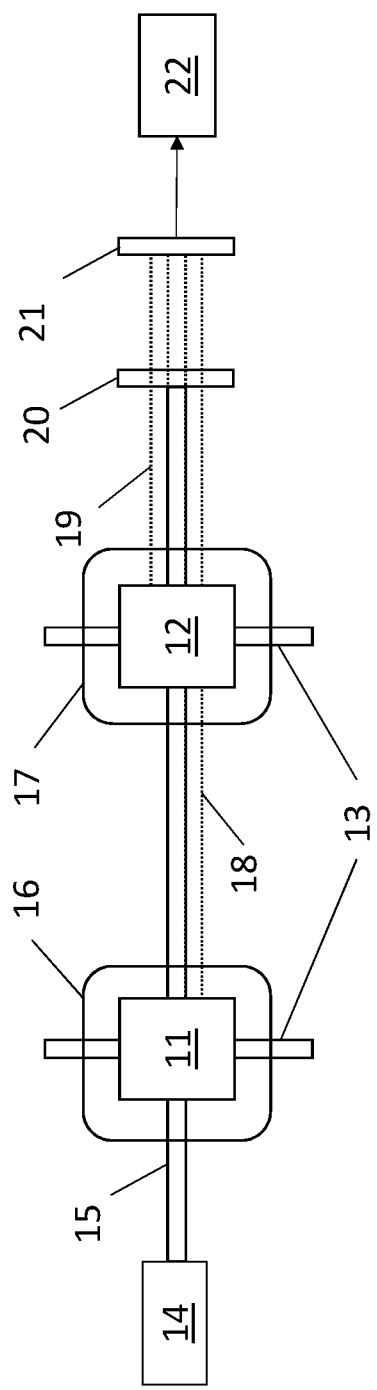
FIG. 2 is a schematic diagram illustrating several components of one embodiment of the present invention.

FIG. 2 is a schematic diagram illustrating several components of one embodiment of the present invention. At least two ensembles of atoms 11 and 12 are confined in at least two locations. The atoms may be selected from the group of $^{85}$Rb, Cs, $^{39}$K, $^{41}$K, and He. The two sets of atoms may be confined inside two separate vapor cells. Alternatively, the two or more sets of atoms can be confined inside a single vapor cell using buffer gas to localize the two sets to defined volumes. In yet another embodiment, the two or more sets of atoms can be confined inside a vacuum chamber using laser cooling. The light 13, that may be an optical pumping light, from a laser is used to spin polarize the atoms through optical pumping. Optionally, two lasers or light beams from two separate lasers could be used to spin polarize the atoms in two different locations. A probe laser 14 emits a probe laser light 15 resonant or nearly resonant with an optical transition in the atoms 11 and 12, such as the D1 or D2 transition. The probe laser light 15 is transmitted through both ensembles of atoms, 11 and 12, consecutively. Pulsed microwave fields, produced by a microwave generator, and transmitted to the cells using radio frequency (RF) transmitting coils 16 and 17, are applied to the two atomic ensembles 11 and 12 at a frequency resonant with the transitions between the Zeeman states 2 and 3 of the two hyperfine states 4 and 5, shown in FIG. 1. The length and amplitude of the microwave pulse is chosen to maximize the sideband generation, 18 and 19, by each of the atomic ensembles 11 and 12. Alternately, coherent population trapping may be used to prepare the atoms in a freely precessing coherent superposition state.

Due to atom-light interaction, after the probe laser light 15 passes the first ensemble of atoms 11, one or more optical sidebands 18, from the first atomic ensemble 11, are generated at a frequency offset with respect to the probe carrier frequency, wherein the probe carrier frequency is defined as the mean optical frequency of the monochromatic probe laser light. The offset optical frequencies of the first set of generated sidebands is equal to the integral multiple of the hyperfine splitting frequency of states 2 and 3, shown in FIG. 1, of atomic ensemble 11. In prior art, Firester and Carver demonstrated the generation of microwave sidebands centered about the probe optical carrier frequency (Firester & Carver, 1966). Additional research in the following years led to a clearer theoretical understanding of the phenomenon. In addition, sideband generation has been explored using four-wave mixing based on coherent population trapping and stimulated Raman emission (Shah et al., 2007; Vukicevic et al., 2000). The four-wave mixing process generates a phase conjugate light field that is shifted in frequency by an amount equal to the ground state splitting frequency (Hemmer et al., 1995).

When the probe laser light 15 passes through the second atomic ensemble 12, at least one or more sidebands 19 are generated. The offset optical frequencies of the second set of generated sidebands 19 is equal to the integral multiple of the hyperfine splitting frequency of states 2 and 3, shown in FIG. 1, of the second atomic ensemble 12.

The probe laser light 15, along with sidebands 18 and 19, passes through an optical filter 20 which removes the probe laser light 15 while leaving the sidebands 18 and 19 mostly unaffected. The optical filter 20 can be, but is not limited to, a polarizer, a narrow-band frequency filter, or an atomic filter cell. After filtering, the light containing the sidebands 18 and 19 is detected using a photodetector 21. Due to presence of magnetic field gradient and differences in the properties of the medium in which the ensemble of atoms 11 and 12 are confined, the optical frequency of the sidebands 18 and 19 can be different. Since the sidebands 18 and 19 are generated from the same probe laser light 15, they are coherent with respect to one another. Thus, when the sidebands 18 and 19 fall on the photodetector 21, a beat note signal may be observed wherein the frequency of the beat note signal is equal to the difference between the optical frequencies of sidebands 18 and 19. Thus, by measuring the frequency of the beat note signal using detection electronics 22, the value of the magnetic field gradient between the two sets of atoms can be obtained. Examples of detection electronics include but not limited to a frequency counter or data acquisition system and signal processor to compute frequency. To ease measurement of the frequency of the beat note signal, a bias magnetic field gradient can be added such that the frequency of the beat note is at an easily measurable value.

Figure 3:
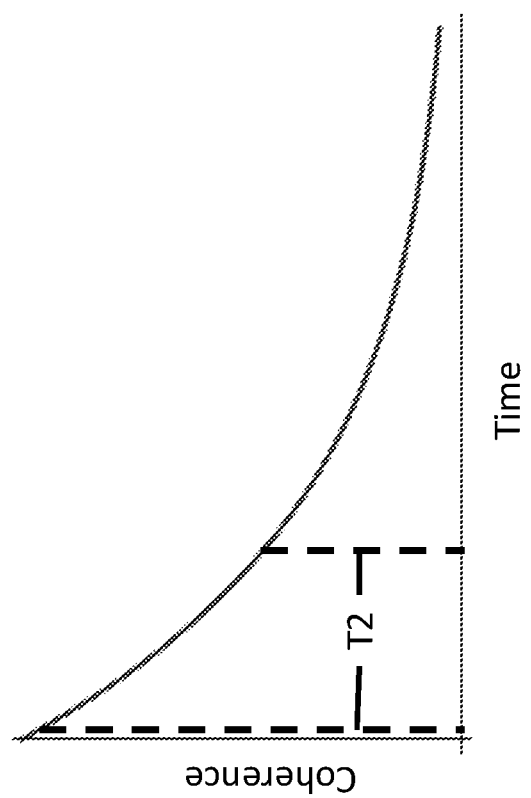
FIG. 3 is a schematic representation of the decay of atomic coherence as a function of time of the present invention. The sideband generation is proportional to atomic coherence.
Figure 4:
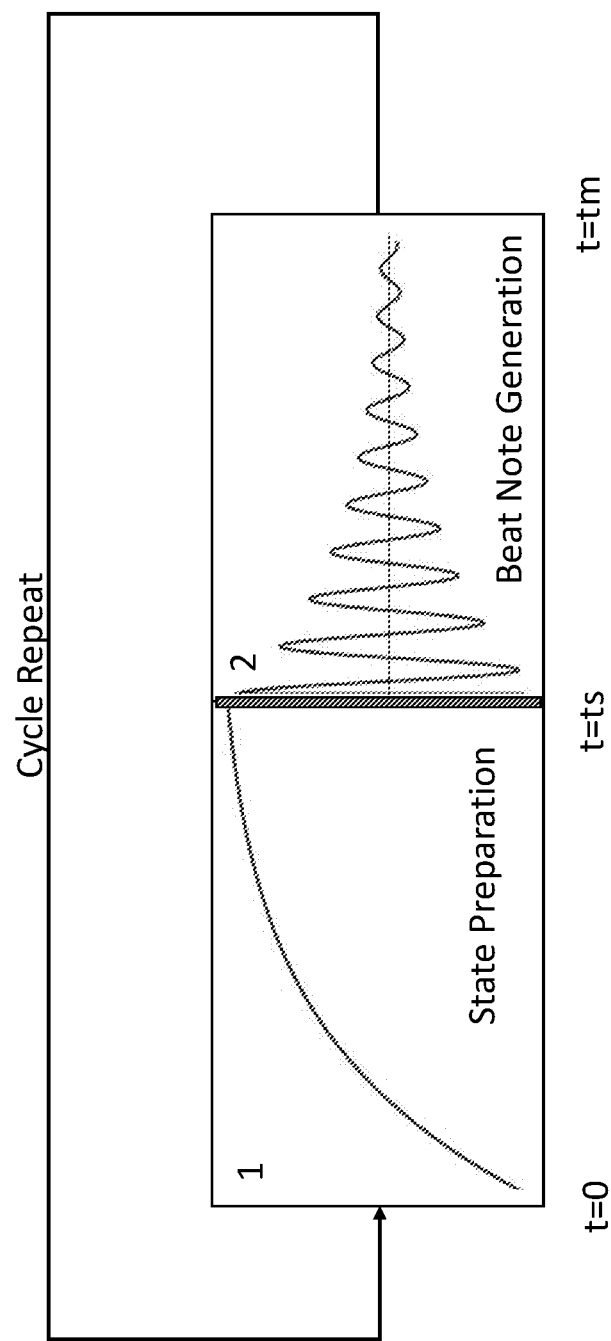
FIG. 4 is schematic representation of the timing interval of the gradiometer operation of the present invention.

The optical sidebands 18, 19 are generated only for the duration of time, when the atoms are in a coherent state, which is typically on the order of 1 ms in the case of $^{87}$Rb atoms confined in a 1 cm vapor cell. The amplitude of the sidebands decays over time as the atoms lose their coherence through various mechanisms such as, but not limited to wall collisions, power broadening or buffer gas collisions. The characteristic time scale over which atoms loose coherence is defined as T2 as shown in FIG. 3. Thus, because the generated beat note signal also decays over time, atoms must be periodically re-pumped to the coherent state. Thus, as shown in FIG. 4, the normal operation of the gradiometer consists of two parts: (1) state preparation which lasts from t=0 to t=$t_s$, and (2) beat note signal generation via sideband generation which lasts from t=$t_s$ to t=$t_m$. Once the beat note signal is substantially extinguished, the measurement process is restarted by re-preparing the atoms in the coherent state at t=0.

EXAMPLE

Figure 5:
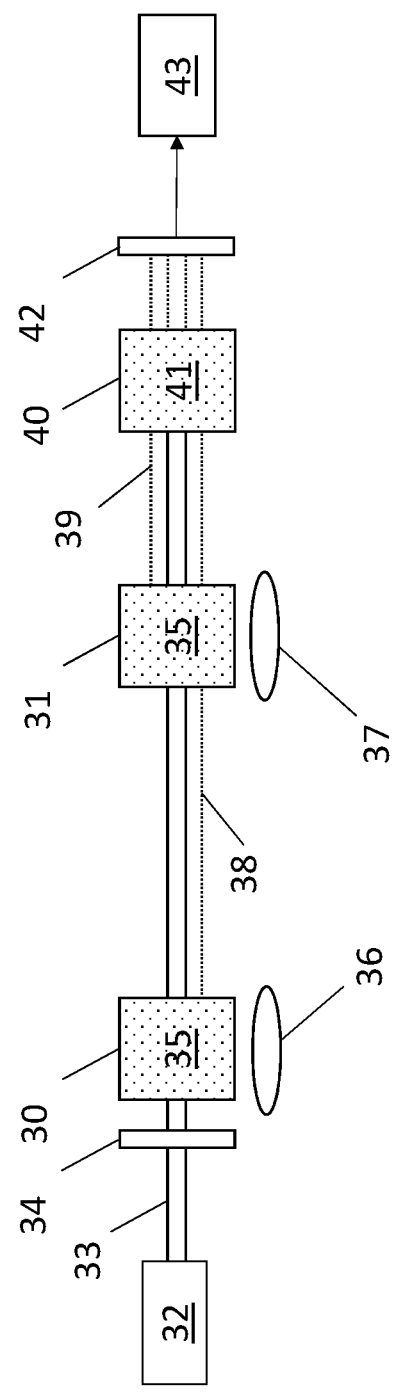
FIG. 5 is a schematic diagram illustrating an example of an embodiment of the present invention.

As an example, a magnetic gradiometer based on microwave sideband generation has been constructed out of two vapor cells 30 and 31 as shown in FIG. 5. A laser with <10 GHz spectral linewidth 32 is used to generate the light beam 33 used for pumping and probing. The light beam was circularly polarized with a quarter-wave plate 34 and the wavelength of the light beam 33 is tuned near the |$5S_{1/2}$, F=2⟩ ↔ |$5P_{1/2}$⟩ transition of $^{87}$Rb atoms 35 confined inside the vapor cells 30 and 31. The light 33 was used to populate the |$5S_{1/2}$, F=2, mF=2⟩ state with high probability. A microwave □/2 pulse at t=$t_m$ is applied to the atoms 35 inside the two vapor cells 30 and 31 with antennas 36 and 37 placed in the vicinity of the cells 30 and 31. The microwave □/2 pulse was resonant with the |$5S2_{1/2}$, F=2, $m_F$=2⟩ |$5S_{1/2}$, F=1, $m_F$=1⟩ transition at the respective atom locations. After the microwave pulse is applied, the atoms 35 in the two vapor cells 30 and 31 start to precess in a coherent superposition of the |$5S_{1/2}$, F=2, $m_F$=2⟩ ↔ |$5S_{1/2}$, F=1, $m_F$=1⟩ states.

As the light beam 33 passed through the vapor cells 30 and 31, optical sidebands 38 and 39 are superimposed over the beam 33 with a frequency offset from the carrier equal to the hyperfine splitting of the atomic transitions. The sideband 38 is created from interaction between light beam 33 and freely precessing coherent atoms 35 in vapor cell 30. Similarly, sideband 39 is created from interaction between light beam 33 and freely precessing coherent atoms 35 in vapor cell 31.

Since the light beam 33, also being the carrier light 33, does not contain any information about the magnetic field or magnetic field gradients, it can be removed with a filter cell 40 containing $^{85}$Rb atoms 41. The cell is optically thick to the carrier light 33 and transparent to light from the sidebands 38 and 39. After the filter cell, most of the remaining light contains just the sidebands 38 and 39. The sideband containing light is detected using a photodetector 42. For the duration of time the sideband generation lasts, the sidebands 38 and 39 interfere over the photodetector 42 to produce a beat note signal whose frequency is extracted. The field gradient is then computed with control electronics 43. Once the beat note signal is substantially decayed, the coherent state preparation portion of the cycle is repeated. The typical state preparation part of the cycle (t=ts) is 1 ms, and the beat note signal generation part of the cycle (t=ts−tm) is 1 ms. Thus, the procedure of beat note generation can be repeated 500 times per second. Depending on the value of the coherence relaxation time, T2, the measurement cycle can be repeated faster or slower than 500 times a second.

Instead of the $^{85}$Rb filter cell 40, an optical cavity can be used to remove the carrier light 33. Here, the cavity is tuned such that the carrier light 33 is absorbed, while the modulations sidebands 38 and 39 are transmitted to the photodetector 42. Alternatively, in some embodiments, a polarizer can be used to remove the carrier light 33 while leaving the sidebands 38, 39 unaffected, as long as the sidebands 38 and 39 are orthogonally polarized with respect to the carrier light 33, as described in prior art by Tang (Tang, 1973).

Instead of using a single laser 32 to create a pump and probe laser light beam 33, separate pump beam 13 and probe beam 15, as in FIG. 2, can be used with optimum polarization and intensity to separately optimize the efficiency of coherent state preparation and optical sideband generation. The pump beam 13 can also be switched-off after the atoms are prepared in the freely precessing coherent state (switched-off from t=$t_m$ to t=$t_s$) to reduce power broadening effects from the pump light.

Although the present invention has been described with reference to the disclosed embodiments, numerous modifications and variations can be made and still the result will come within the scope of the invention. No limitation with respect to the specific embodiments disclosed herein is intended or should be inferred. Each apparatus embodiment described herein has numerous equivalents.

REFERENCES

Budker and Romalis, 2010: Budker, D. and M. Romalis, Optical magnetometry. Nat Phys, 2007. 3(4): p. 227-234
Arditi, U.S. Pat. No. 3,281,663 A
Optically pumped magnetometer using microwave transitions (1966)
Affolderbach 2002: Affolderbach, C., Stähler, M., Knappe, S., Wynands, An all-optical, high-sensitivity magnetic gradiometer, Appl. Phys. B 75, 605-612 (2002).
Firester & Carver, 1966: Firester, A. H., Carver, T. R., 1966. Light Modulation at the Ground-State Hyperfine-Separation Frequency of Potassium. Phys. Rev. Lett. 17, 947-949.
Mathur 1968: Mathur, B. S., Tang, H., Bulos, R., Happer, W., 1968. Microwave Light Modulation by an Optically Pumped Rb87 Vapor. Phys. Rev. Lett. 21, 1035-1038
Tang 1973: Tang, H., 1973. Parametric Frequency Conversion of Resonance Radiation in Optically Pumped Rb87 Vapor. Phys. Rev. A 7, 2010-2032
Shah et al., 2007: Shah, V., Knappe, S., Hollberg, L., Kitching, J., 2007. High-contrast coherent population trapping resonances using four-wave mixing in 87Rb. Opt. Lett. 32, 1244-1246.
Vukicevic et al., 2000: N. Vukicevic, A. Zibrov, L. Hollberg, F. Walls, J. Kitching, and H. Robinson, IEEE Trans. Ultrason. Ferroelectr. Freq. Control 47, 1122 (2000).
Hemmer et al., 1995: P. R. Hemmer, D. P. Katz, J. Donoghue, M. Cronin-Golomb, M. S. Shahriar, P. Kummar, "Efficient low-intensity optical phase conjugation based on coherent population trapping in sodium," Opt. Lett., vol. 20, p. 982, 1995.
Lu et al., 1998: B. Lu, W. H. Burkett, M. Xiao, "Efficient low-intensity optical phase conjugation based on coherent population trapping in sodium," Opt. Lett., vol. 23, pp. 804-806, 1998

What is claimed is:
1. A system for measuring a magnetic field gradient, the system comprising:
   a) at least two sets of atoms confined in two separate locations;
   b) a means to prepare the two sets of atoms in a freely precessing coherent superposition of magnetically sensitive states of two different hyperfine ground states, wherein the same magnetically sensitive states are chosen for both sets of atoms;

c) a probe light beam configured to pass through the two sets of freely precessing atoms in a way that generates optical sidebands at microwave frequencies through interaction between the probe light and each set of freely precessing atoms;

d) a photodetector configured to measure a beat note between the generated optical sidebands; and e) a controller programmed to measure the frequency or the phase of the beat note to estimate gradient magnetic field between the two sets of atoms.

2. The system of claim 1, wherein the atoms are confined in vapor cells.

3. The system of claim 1, wherein the atoms are alkali atoms.

4. The system of claim 1, wherein the means to create two sets of freely precessing atoms is coherent population trapping.

5. The system of claim 1, wherein the means to create two sets of freely precessing atoms is optical pumping and a resonant microwave pulse.

6. The system of claim 5, wherein the optical filter is selected from the group including a polarizer, an atomic filter cell, and an optical cavity.

7. The system of claim 1 further comprising an optical filter to remove the probe light beam light after it has passed through the two sets of atoms.

8. The system of claim 1 further comprising a means to apply a bias gradient applied such that the beat frequency has a non-zero value.

9. A system for measuring a magnetic field gradient, the system comprising:
   a. at least two sets of alkali atoms, each confined in a vapor cell;
   b. a means to optically pump the two sets of atoms predominantly into a single magnetically sensitive ground state;
   c. a microwave transmitter applying a resonant pulse to prepare the atoms in a freely precessing coherent superposition of magnetically sensitive states of two different hyperfine ground states;
   d. a probe light beam configured to pass through the two sets of freely precessing atoms in a way that generates optical sidebands at microwave frequencies through interaction of the probe light beam and each set of freely precessing atoms;
   e. a photodetector configured to measure a beat note between the generated optical sidebands; and
   f. a controller programmed to measure the frequency or the phase of the beat note signal to estimate gradient magnetic field between the two sets of atoms.

10. A method for measuring the magnetic field gradient, the method comprising the steps of:
   a. preparing alkali atoms in at least two locations in a freely precessing coherent superposition of magnetically sensitive states chosen from two different hyperfine ground states;
   b. passing a probe light beam through the atoms in the two locations;
   c. configuring the probe light beam such that optical sidebands are self-generated over the probe light beam through interaction with the atoms in the two locations;
   d. capturing the probe light beam and the optical sidebands using a photodetector;
   e. measuring the frequency or the phase of the beat note signal produced by the photodetector, wherein the beat note signal is produced by the interference of the optical sidebands; and
   f. calculating the gradient magnetic field between the alkali atoms in the at least two locations based on the frequency or the phase of the beat note.

11. The method of claim 10, wherein the alkali atoms are confined in vapor cells.

12. The method of claim 10, wherein the alkali atoms are prepared in a freely precessing coherent superposition state using coherent population trapping.

13. The method of claim 10, wherein the alkali atoms are prepared in a freely precessing coherent superposition state using optical pumping and a resonant microwave pulse.

14. The method of claim 10 further comprising removing the probe light beam with a narrow band optical filter.

15. The method of claim 10, wherein the probe light beam is removed using a polarizer or an atomic filter cell or an optical cavity.

16. The method of claim 10 further comprising applying a bias gradient such that the beat frequency has a non-zero value.

* * * * *